United States Patent [19]
Tsui et al.

[11] Patent Number: 6,066,890
[45] Date of Patent: *May 23, 2000

[54] SEPARATE CIRCUIT DEVICES IN AN INTRA-PACKAGE CONFIGURATION AND ASSEMBLY TECHNIQUES

[75] Inventors: Anthony C. Tsui, Saratoga; Y. Mohammed Kasem, Santa Clara, both of Calif.

[73] Assignee: Siliconix incorporated, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/556,369

[22] Filed: Nov. 13, 1995

[51] Int. Cl.[7] .................................................. H01L 23/34
[52] U.S. Cl. .......................................... 257/723; 257/676
[58] Field of Search ..................................... 257/676, 723

[56] References Cited

U.S. PATENT DOCUMENTS

| | | | |
|---|---|---|---|
| 4,794,431 | 12/1988 | Park | 257/676 |
| 5,057,906 | 10/1991 | Ishigami | 257/723 |
| 5,075,758 | 12/1991 | Aizawa | 257/676 |
| 5,245,215 | 9/1993 | Sawaya | 257/676 |
| 5,245,216 | 9/1993 | Sako | 257/676 |
| 5,313,095 | 5/1994 | Tagawa et al. | 257/672 |
| 5,319,246 | 6/1994 | Leicht et al. | 257/692 |
| 5,399,905 | 3/1995 | Honda et al. | 257/666 |
| 5,442,228 | 8/1995 | Pham et al. | 257/659 |
| 5,545,922 | 8/1996 | Golwalkar et al. | 257/676 |

FOREIGN PATENT DOCUMENTS

| | | | |
|---|---|---|---|
| 0 443 044 A1 | 8/1991 | European Pat. Off. | H01L 23/48 |
| 0 540 926 A1 | 5/1993 | European Pat. Off. | H01L 25/18 |
| 63-136838 | 6/1988 | Japan | H04B 9/00 |
| 06232332 | 8/1994 | Japan | H01L 23/60 |
| 1 255 073 | 11/1971 | United Kingdom | H05K 5/06 |
| 94/11929 | 5/1994 | WIPO | H01S 3/025 |

*Primary Examiner*—Carl Whitehead, Jr.
*Assistant Examiner*—Roy Potter
*Attorney, Agent, or Firm*—Skjerven, Morrill, MacPherson, Franklin & Friel, L.L.P.; Kent B. Chambers; Dale R. Cook

[57] ABSTRACT

A multiple integrated circuit intra-package configuration having a centrally mounted integrated circuit die and an additional circuit device mounted in the package periphery. The additional circuit device may provide multiple functions, for example, to protect and enhance the performance of the integrated circuit die. Examples of such functions are electrostatic discharge protection circuits and temperature sensing. The intra-package circuit device avoids problems such as simple and complex process compatibility and additional space requirements of utilizing components external to the package. The multiple circuit intra-package configuration utilizes the small space available in the vicinity of lead posts in integrated circuit packages such as SOIC and TSSOP configurations to mount circuit devices. In one embodiment, a circuit device, for example, a diode, is mounted on a lead post and connected as desired using any of a variety of connectability alternatives such as wire bonding. In another embodiment, the integrated circuit die is attached conventionally to a die pad having a die pad extension disposed between lead posts. A circuit device is mounted on the die pad extension and connected as desired. Additionally, within the same package multiple circuit devices may be present and a large number of interconnectability options and versatile configurations are available.

31 Claims, 8 Drawing Sheets

SEPARATE CIRCUIT DEVICES IN AN INTRA-PACKAGE CONFIGURATION AND ASSEMBLY TECHNIQUES

FIELD OF THE INVENTION

This invention relates to packaged circuit devices and more particularly to separate circuit devices incorporated with semiconductor devices within the same package and associated assembly techniques.

BACKGROUND

Semiconductor devices are packaged in a variety of package types such as in a dual-in-line package ("DIP"), thin shrunk small outline package ("TSSOP"), ceramic DIP package ("CERDIP"), plastic DIP ("PDIP"), zig-zag-in-line package ("ZIP"), small outline integrated circuit ("SOIC"), small outline J-bend lead package ("SOJ"), small outline package ("SOP"), and a thin small outline package ("TSOP").

Typically, integrated circuit packages contain a single integrated circuit die mounted on a centralized die pad within the package. Other integrated circuit packages, typically referred to as multi-chip modules ("MCM"), contain two or more integrated circuit dice mounted on a centralized die pad or respective centralized die pads within the package. The integrated circuit dice in an MCM are often LSI, VLSI, and/or ULSI circuits.

Often a need exists to add circuit devices to existing devices and device designs. A packaged single integrated circuit die or an MCM may require multiple additional circuit devices. For semiconductor devices, there is frequently the need, for example, to add multiple function circuits to protect and enhance device performance. Examples of such protection and performance enhancing circuits are temperature sensing circuits with voltage and current detection and electrostatic discharge ("ESD") protection circuits.

At present, the conventional methods typically achieve an additional function by adding a circuit(s) externally to the semiconductor package ("external approach") or integrating the additional circuit(s) with the semiconductor device on the same wafer ("monolithic approach") within a package.

The external approach suffers from several disadvantages. For example, the external approach incurs additional packaging costs and additional assembly time in relation to the monolithic approach. The external approach also typically requires more space than a comparable monolithic approach.

The monolithic approach exhibits several disadvantages as well. The monolithic approach often requires integrating a simple process(es) associated with the additional circuit(s) with a relatively complex process during fabrication. The simple process requires compatibility with all previous and subsequent process steps. Additionally, the monolithic approach typically provides a common base to all circuits which can produce inter-circuit interference. Furthermore, integrating an additional circuit(s) to a previously defined integrated circuit design, especially after production has begun, incurs substantial associated expenses such as new layout costs, mask preparation, and process compatibility analysis.

SUMMARY

The present invention offers at the assembly level a low cost hybrid approach alternative to the conventional external and monolithic circuit packaging approaches. The present invention is applicable, for example, to a packaged single integrated circuit die and to MCM packages. In accordance with the present invention, a plurality of circuit devices are disposed within a common circuit package. The present invention in one embodiment utilizes the small space available in the peripheral region of a circuit package to mount a circuit device on a circuit mounting platform. Although lead posts in a circuit package are conventionally used only for wire interconnection sites, in another embodiment of the present invention the circuit mounting platform is a lead post. In another embodiment, the circuit mounting platform is, for example, a tab such as a die pad extension, or a combination of lead post(s) and die pad extension(s). In another embodiment, low cost assembly techniques are used to attach a separate circuit device to a circuit mounting platform located in a circuit package periphery and to couple the separate circuit device to other circuit mounting platforms and/or an integrated circuit die present in the same package.

The present invention in another embodiment is a circuit package configuration that includes an encapsulant having an interior region and a periphery region. The circuit package configuration also includes a die pad disposed within the encapsulant, an integrated circuit die disposed on the die pad in an interior region of the encapsulant, a circuit mounting platform disposed in the encapsulant periphery region, and a circuit device disposed on the circuit mounting platform and coupled to the integrated circuit die.

BRIEF DESCRIPTION OF THE DRAWINGS

Reference numerals referring to the same feature appearing in multiple figures are the same.

DETAILED DESCRIPTION

The following description is intended to be illustrative only and not limiting.

Figure 1:
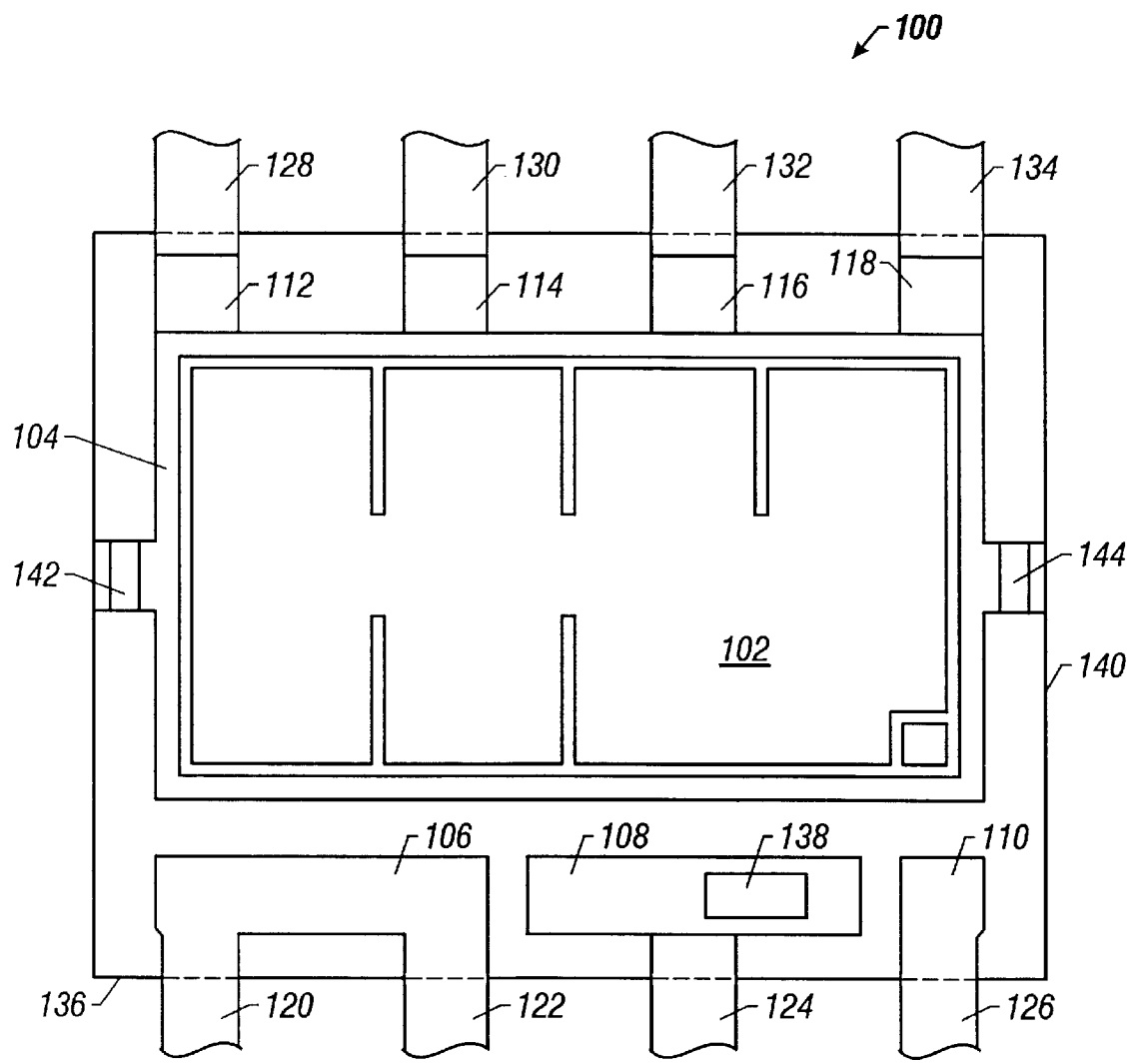
FIG. 1 illustrates a cross-sectional top view of packaged integrated circuit with a separate circuit device mounted on a lead post.

Referring to FIG. 1, eight lead ("8L") SOIC integrated circuit package configuration ("ICP configuration") 100 includes a 0.091×0.158 inches (2.31×4.01 mm) semiconductor integrated circuit die 102 downset mounted on a 0.1×0.166 inches (2.54×4.22 mm) die pad 104 using conventional mounting techniques and materials within the confines of plastic encapsulant 140. Lead posts 106, 108, 110, 112, 114, 116, and 118 are located along two sides of the integrated circuit 102 also within the confines of plastic encapsulant 140. Leads 120, 122, 124, 126, 128, 130, 132, and 134 extend external to the plastic encapsulant perimeter 136 to provide external interconnection sites. Lead posts 106, 108, 110, 112, 114, 116, and 118 and leads 120 122, 124, 126, 128, 130, 132, and 134 may be any conductive material suitable for ICP configurations such as aluminum, copper, gold, and other metals and alloys.

Separate circuit 138 is a planar structure, i.e. having no bottom vertical interconnections, mounted on lead post 108, which serves as a die pad for circuit 138, with conventional assembly techniques using conductive epoxy, soldering material, eutectic materials and methods, or any other suitable materials and methods. The circuit 138 may be mounted to lead post 108 at any time during the assembly process of ICP configuration 100 prior to encapsulation and interconnection of circuit 138 to sites in accordance with specific circuit design and layout. The circuit 138 represents a generic circuit which may be, for example, an integrated circuit die such as a diode or temperature protection circuitry, other ESD protection circuitry, a discrete electrical device, integrated circuit dice, a small packaged integrated circuit, or any semiconductor device not specifically mentioned. Circuit 138 may, for example, be connected, through electrical interconnections (not shown in FIG. 1), to integrated circuit die 102, and/or another separate circuit device (not shown), and/or a circuit or device (not shown) external to ICP configuration 100. Although FIGS. 2 and 3 illustrate circuit 138 as a two terminal device, circuit 138 may include other terminals as necessitated by the particular circuit.

In FIG. 1, the lead posts 106, 108, 110, 112, 114, 116, and 118 are 0.014 inches (0.36 mm) wide. Assuming for illustrative purposes that circuit 138 is a diode, the 0.010×0.020 inch (0.254×0.508 mm) circuit 138 is attached to 0.014× 0.050 (0.36×1.27 mm) lead post 108. The 0.091×0.158 inch (2.31×4.01 mm) integrated circuit die 102 is attached to a 0.100×0.166 inch (2.54× 4.22 mm) pad 104. The leads 120, 122, 124, 126, 128, 130, 132, and 134 are 0.016 inches (0.406 mm) wide. Although specific dimensions and structural configurations have been given, it will be understood by one of ordinary skill in the art after reading this description that other dimensions and structural configurations may be used for example, a die pad may be mounted on lead post 108 prior to circuit 138 attachment.

ICP configuration 100 with circuit 138 incorporates the low cost assembly techniques of mounting and interconnecting two separate circuits (circuit 138 and integrated circuit die 102) within a single ICP configuration while avoiding monolithic approach and external approach problems. Additionally, FIGS. 1–13 show several separate circuit placements and various interconnections which illustratively demonstrate versatility aspects of the intra-package separate circuits configuration.

Figure 2:
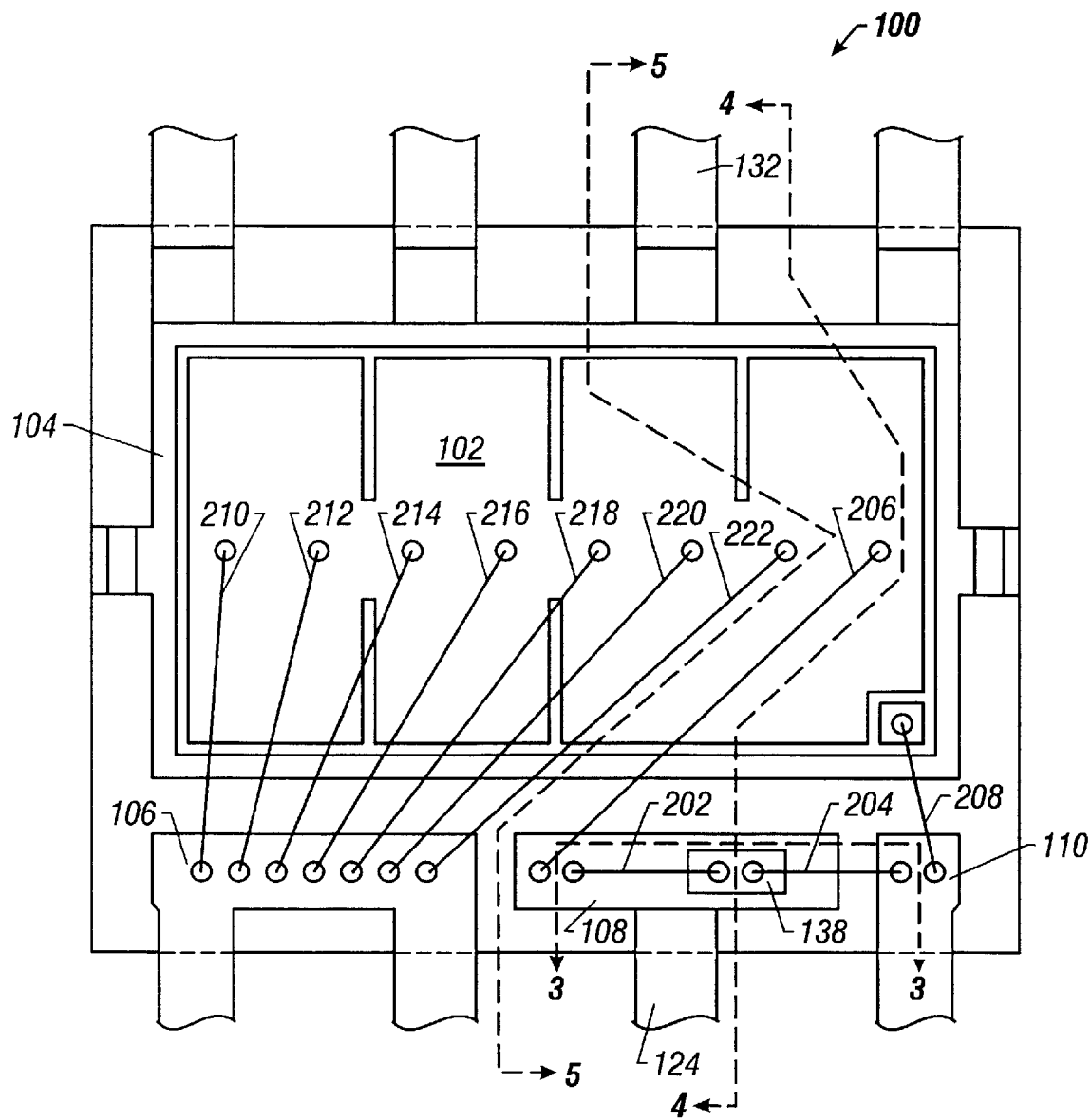
FIG. 2 illustrates the assembly of FIG. 1 with a plurality of wire interconnections.
Figure 3:
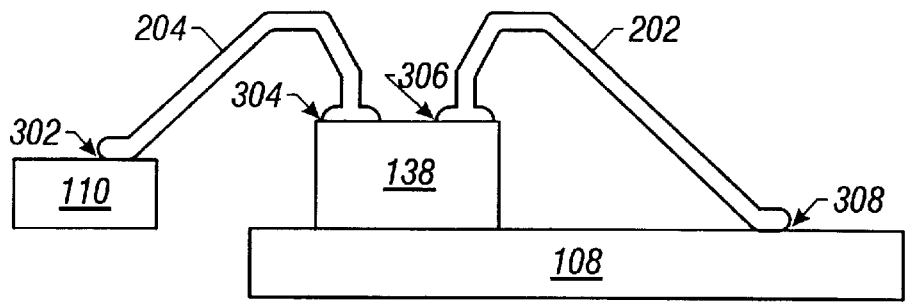
FIG. 3 illustrates a close-up cross-sectional side view of the separate circuit device placement and wire interconnection of FIG. 2.

Referring to FIG. 2, wires 202 and 204 interconnect circuit 138 and lead posts 108 and 110, respectively. Wires 206 and 208 interconnect lead posts 108 and 110, respectively, to integrated circuit die 102. Wires 210, 212, 214, 216, 218, 220, and 222 interconnect lead post 106 to various integrated circuit die 102 locations such as those shown in FIG. 2. Although specific wire interconnection terminal points are shown, it will be understood by one of ordinary skill in the art in light of this description that circuit 138 may be connected to additional and/or alternative sites as required by specific circuit designs. For example, circuit 138 may be electrically connected, through at least one of the leads 120, 122, 124, 126, 128, 130, 132, and 134 and/or through another separate circuit (not shown) mounted within plastic encapsulant 140, to a circuit or device external (not shown) to ICP configuration 100 without being electrically connected to integrated circuit die 102. Additionally, although a specific circuit 138 mounting location is shown, it will be understood by one of ordinary skill in the art in light of this description that circuit 138 may be mounted to additional and/or alternative sites, for example lead posts 128, 130, 132, or 134 or tie bars 142 or 144, as desired to accommodate specific designs.

The wire interconnections of FIG. 2 and the following Figures are made by conventional stitch wire bonding or any other suitable method unless otherwise indicated.

FIG. 3 illustrates a close-up cross-sectional side view through line 3—3 on FIG. 2 of the separate circuit device 138 placement and wire interconnections to lead posts 110 and 108. The height of circuit 138 is 0.010 inches (0.254 mm), and the loop height of wire interconnections 202 and 204 is 0.012 inches (0.305 mm) measured from the top plane of circuit 138. Although specific loop heights are given, other loop heights may be suitable for other packages. A 0.029 inch (0.737 mm) lateral separation exists between interconnection sites 302 and 304, and a 0.025 inch (0.635 mm) lateral separation exists between interconnection sites 306 and 308.

Figure 4:
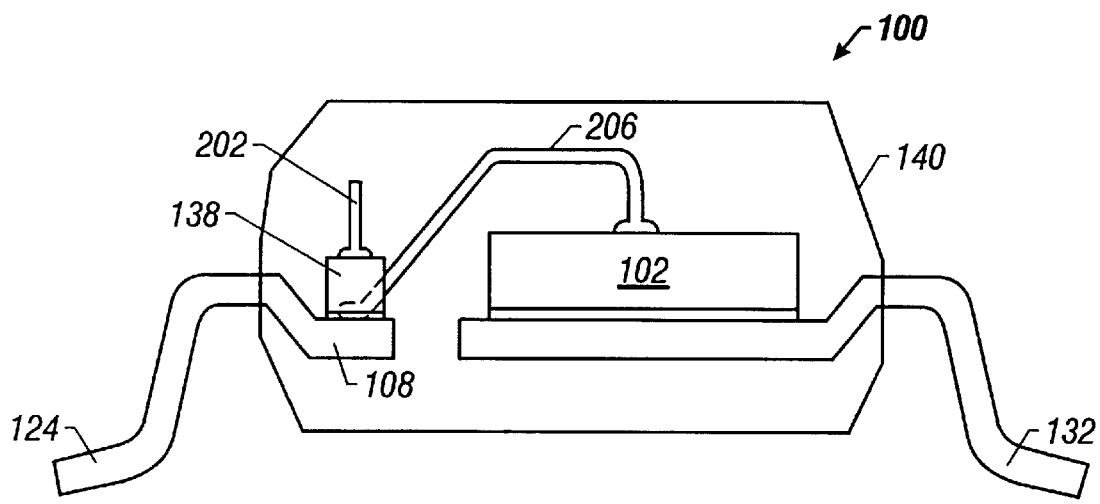
FIG. 4 illustrates a cross-sectional front view of the packaged integrated circuit of FIG. 1 showing the separate circuit and wire placement.

FIG. 4 illustrates a cross-sectional front view through line 4—4 of FIG. 2 of ICP configuration 100 showing circuit 138 and wire interconnections 202 and 206 between circuit 138 and lead post 108 and from lead post 108 to integrated circuit die 102, respectively.

Figure 5:
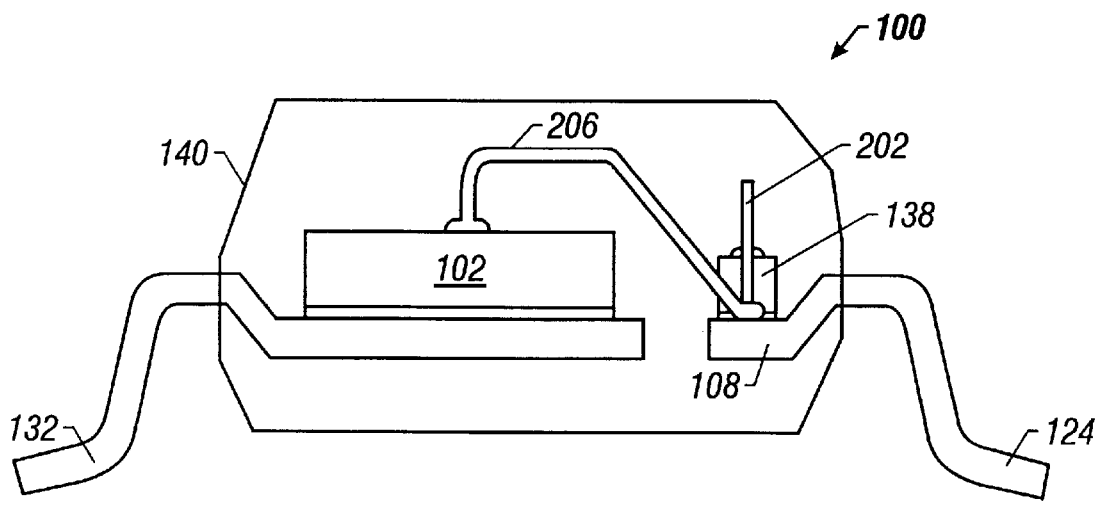
FIG. 5 illustrates a cross-sectional rear view of the packaged integrated circuit of FIG. 1 showing the separate circuit and wire placement.

FIG. 5 illustrates a cross-sectional rear view through line 5—5 of FIG. 2 of ICP configuration 100 showing the circuit 138 and interconnection placements of wires 202 and 206.

Figure 6:
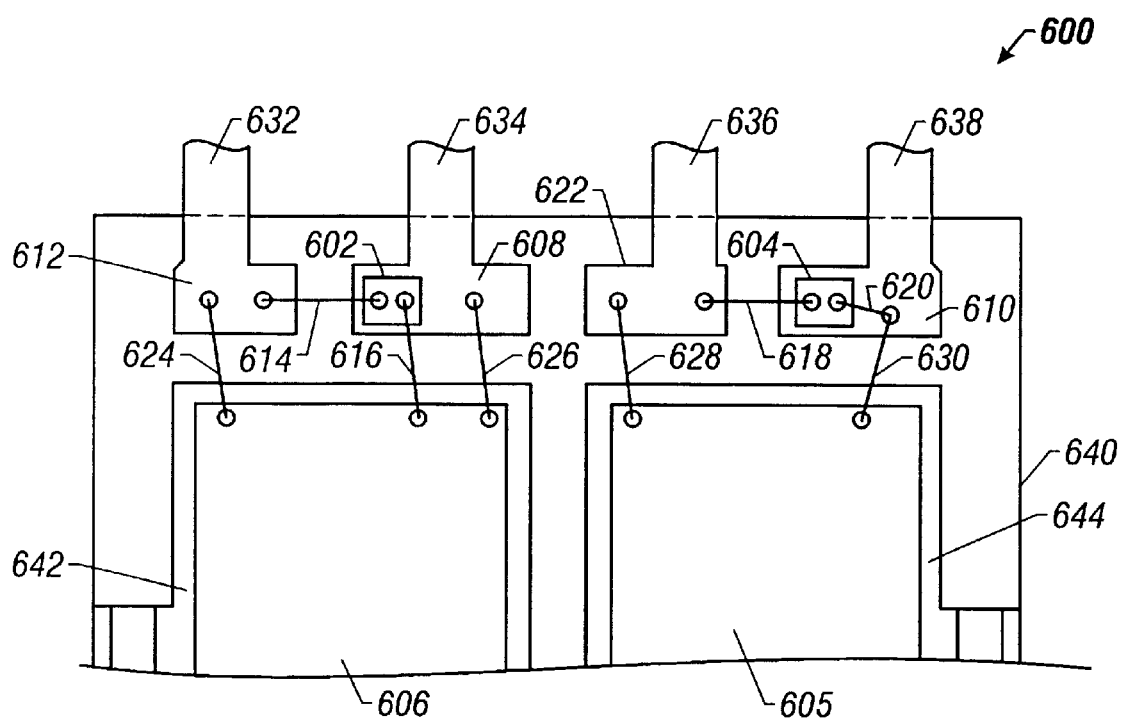
FIG. 6 illustrates a partial cross-sectional view of a packaged integrated circuit with two additional separate circuits mounted on lead posts with wire interconnections.

Referring to FIG. 6, a partial cross-sectional view of 8L SOIC ICP configuration 600 is illustrated having multiple lead post mounted separate circuits 602 and 604 utilizing alternative connection schemes. Separate circuits 602 and 604 represent circuits such as those represented by separate circuit 138. ICP configuration 600 includes leads 632, 634, 636, and 638 extending from plastic encapsulant 640. ICP configuration 600 also includes circuits 602 and 604 mounted on lead posts 608 and 610, respectively. The two circuits 602 and 604 are mounted separately from integrated circuit dice 605 and 606, mounted on die pads 642 and 644, respectively. Conventional assembly techniques mount circuits 602 and 604 using conductive epoxy, soldering material, eutectic materials and methods, or any other suitable materials and methods.

FIG. 6 also illustrates wire interconnections between circuit 602 and lead post 614 and ICP configuration 606 using wires 614 and 616, respectively. Wires 618 and 620 connect circuit 604 to lead posts 622 and 610, respectively. Lead posts 622 and 610 are connected to integrated circuit die 605 with wires 628 and 630, respectively. Lead posts 612 and 608 are connected to integrated circuit die 606 with wires 624 and 626, respectively. ICP configuration 600 exhibits the advantages of ICP configuration 100 and additionally provides added functional capability and versatility with circuits 602 and 604 within a common plastic encapsulant 640.

Figure 7:
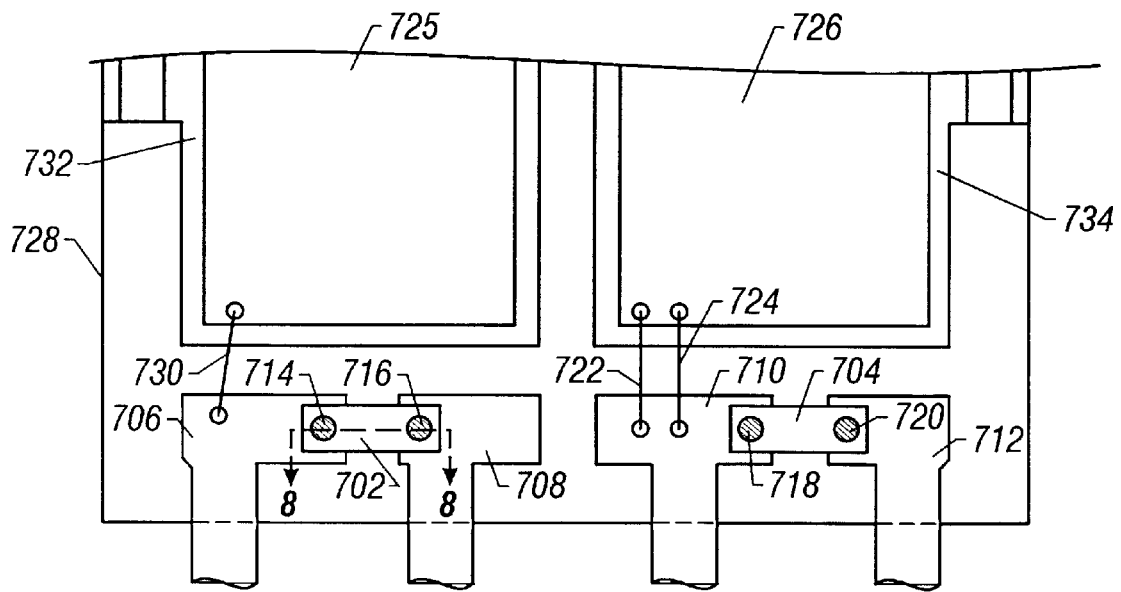
FIG. 7 illustrates a cross-sectional top view of a packaged integrated circuit with two additional separate circuits respectively mounted on two lead posts with vertical and wire interconnections.

In FIG. 7, SOIC ICP configuration 700 includes separate circuit 702. Separate circuits 702 and 704 are "flip chip" bonded, i.e. electrically interconnected via backside contacts using, for example, conventional bonding materials. Separate circuit 702 is vertically interconnected by flip chip bonding with bottom conductive contacts 714 and 716 to lead posts 706 and 708, respectively. Separate circuit 704 is vertically interconnected by flip chip bonding with bottom conductive contacts 718 and 720 to lead posts 710 and 712, respectively. The conductive contacts 714, 716, 718, and 720 are made of metal or other suitable conductive material. Conventionally, circuits are flip chip mounted on a continuous surface. However, flip chip bonded separate circuits 702 and 704 bridge between two discontinuous surfaces, lead posts 706 and 708 and lead posts 710 and 712, respectively.

Figure 8:
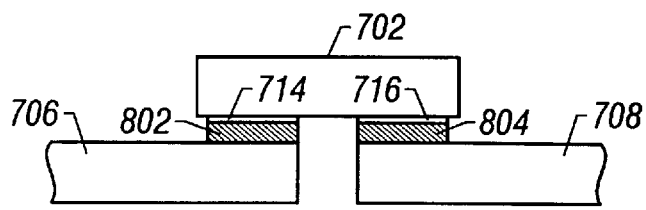
FIG. 8 illustrates a close-up cross-sectional view of one of the additional separate circuits of FIG. 7.

FIG. 8 illustrates a close-up cross-sectional view of circuit 702 through line 8—8 in FIG. 7. As shown in FIG. 8, circuit 702 is attached between lead posts 706 and 708 with conductive materials 802 and 804. The conductive materials 802 and 804 are, for example conductive epoxy, soldering material, eutectic materials, or any other suitable materials and methods. Respective lead posts are preferably separated by a minimum gap distance to provide electrical isolation between the respective lead posts. For example, a minimum gap distance of approximately 0.005 inch (0.127 mm) is suitable for an 8L SOIC package. The gap between lead posts 706 and 708 prevents unnecessary mechanical strain on circuit 702 and allows adequate contact surface area between conductive contacts 714 and 716 and lead posts 706 and 708, respectively. Conductive materials such as conductive materials 802 and 804 also attach circuit 704 to lead posts 710 and 712. In addition, for circuits having more than two terminals, other vertical interconnections may be made with additional bottom conductive material. As an alternative, circuits 702 and 704 may be attached as a planar structure with interconnections provided by wire bonding or other suitable methods and materials. In another alternative, circuits 702 and 704 use a combination of vertical interconnections and wire interconnections.

Referring to FIG. 7, wire 730 interconnects lead post 706 to integrated circuit die 725, mounted on die pad 732, and wires 722 and 724 interconnect two separate interconnection sites on integrated circuit die 726, mounted on die pad 734. The vertical interconnections of circuits 702 and 704 result in a low profile circuit and eliminate wire connections between circuit 702 and lead posts 706 and 708 and between circuit 704 and lead posts 710 and 712. ICP configuration 700 also exhibits the additional advantages of ICP configuration 600 discussed above.

Figure 9:
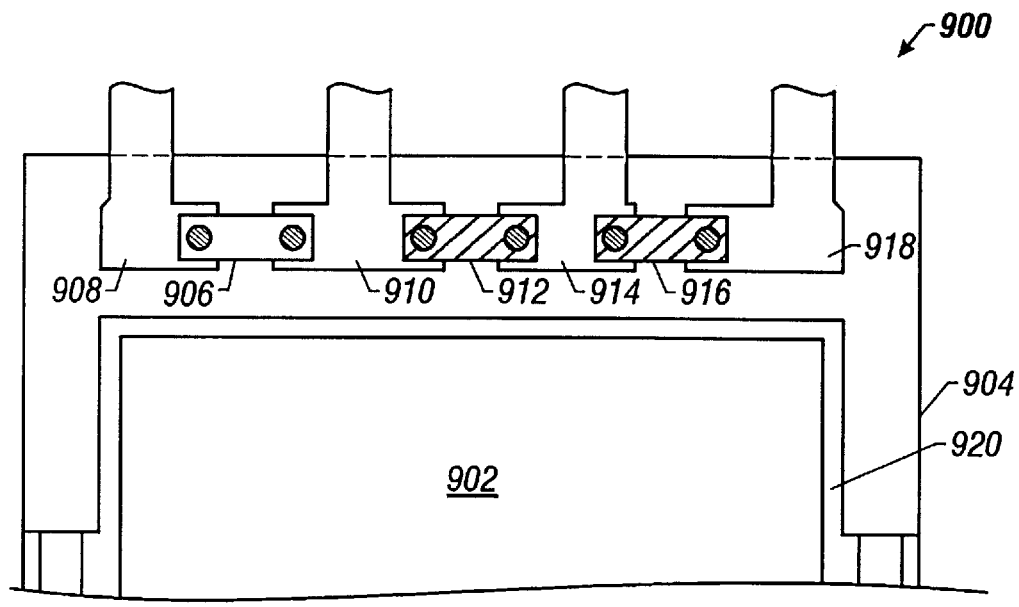
FIG. 9 illustrates a cross-sectional top view of a packaged integrated circuit with an additional separate circuit mounted on two lead posts with vertical and metal strip interconnections.

In FIG. 9, a partial cross-sectional view of a general surface mount device ICP configuration 900 is illustrated. ICP configuration 900 includes a semiconductor integrated circuit die 902 mounted on die pad 920 with conventional techniques and materials within the confines of plastic encapsulant 904. FIG. 9 includes separate circuit 906 vertically interconnected between lead posts 908 and 910 using vertical interconnection assembly techniques and materials as discussed above in conjunction with circuit 702 (FIGS. 7 and 8). Vertical interconnection between metal strip 912 and lead post 910 and 914, and vertical interconnection between metal strip 916 and lead post 914 and 918 is accomplished using conductive epoxy, soldering material, eutectic materials and methods, or with other suitable assembly materials and techniques. The metal strips may be any metal, for example, aluminum, copper, gold, or metal alloys.

ICP configuration 900 offers a low profile separate circuit 906 interconnection between lead posts 908 and 910 and low profile interconnections between lead posts 910, 914, and 918 via metal strips 912 and 916. Additionally, ICP configuration 900 offers the advantages discussed above with ICP configuration 100.

Figure 10:
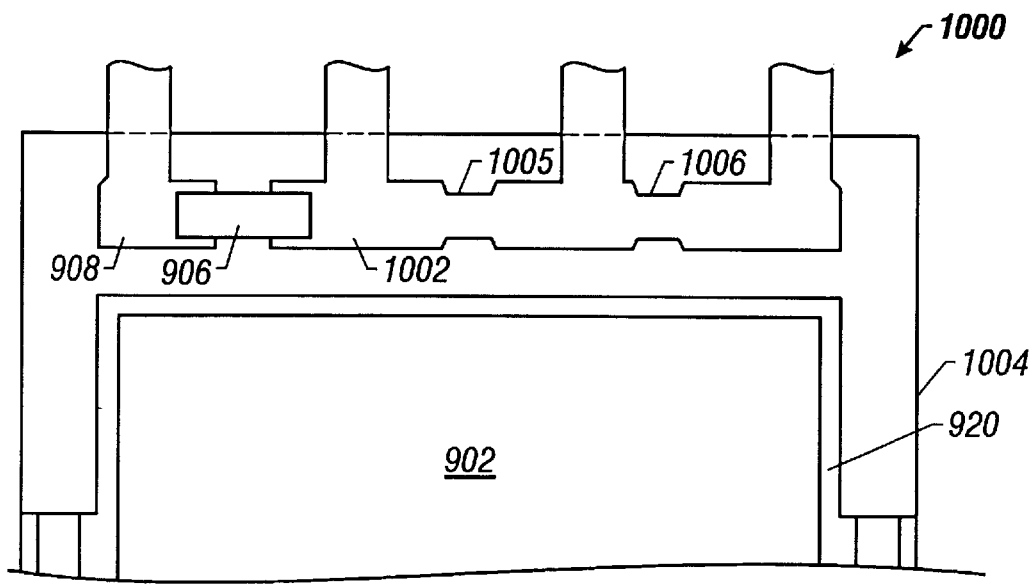
FIG. 10 illustrates a cross-sectional top view of a packaged integrated circuit with an additional separate circuit mounted on two lead posts with vertical and corrugated continuous lead post interconnections.

Referring to FIG. 10, a partial cross-sectional view of a general surface mount device ICP configuration 1000 is illustrated. ICP configuration 1000 is identical to ICP configuration 900 excepting that metal strips 912 and 918 (FIG. 9) have been replaced with a common lead post 1002. Corrugations 1005 and 1006 reinforce grippage of plastic encapsulant 1004 to lead post 1002. In addition to improved plastic encapsulant 1004 grippage, ICP configuration 1000 offers the advantages discussed with ICP configuration 900.

Figure 11:
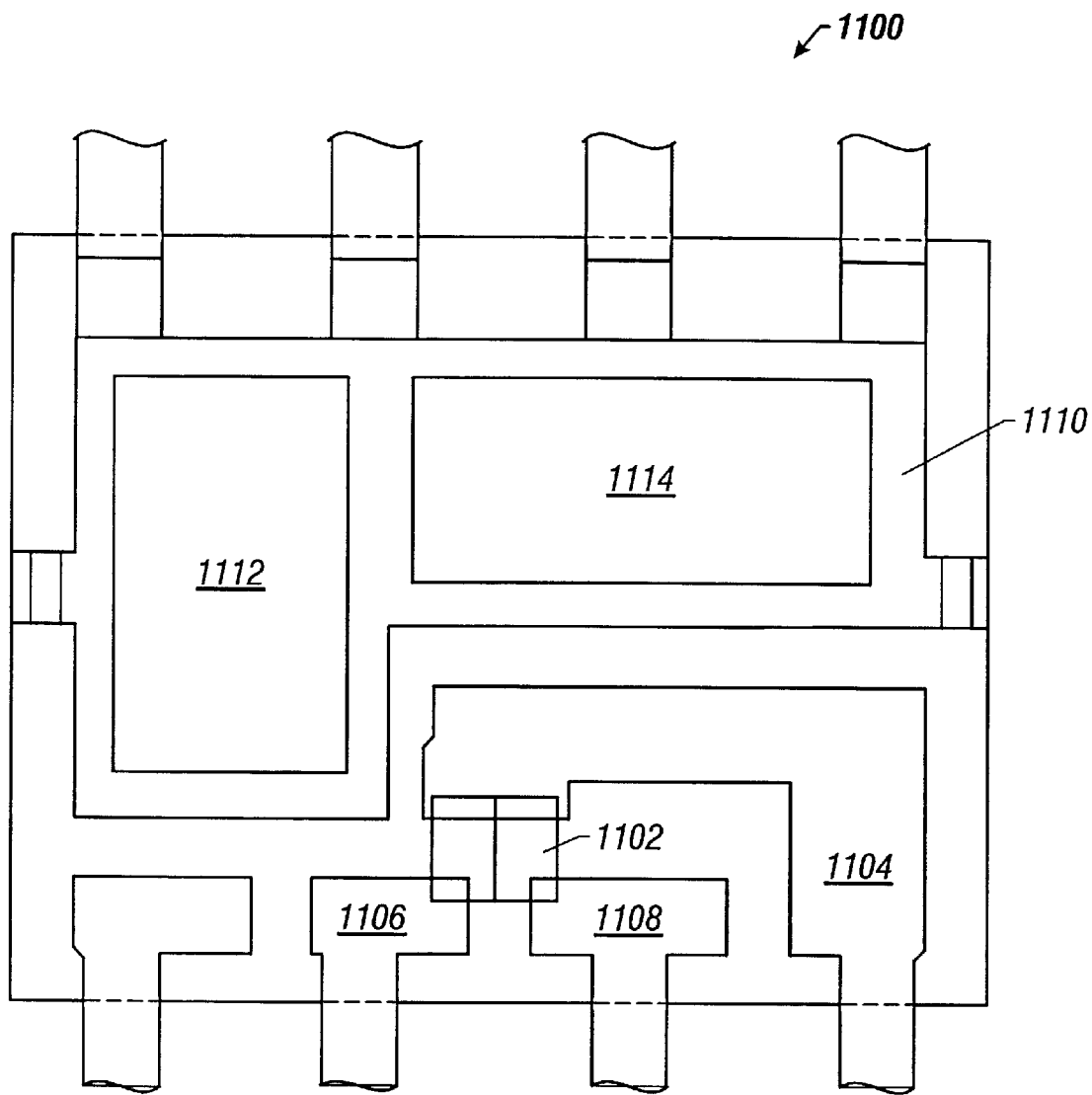
FIG. 11 illustrates a cross-sectional top view of a packaged integrated circuit with an additional separate circuit mounted on three lead posts.

Referring to FIG. 11, a cross-sectional view of SOIC ICP configuration 1100 is illustrated. The configuration of die pad 1110 allows lead post 1104 to extend proximate to lead posts 1106 and 1108 thereby allowing attachment of separate circuit 1102 to lead posts 1104, 1106, and 1108. Circuit 1102 may be vertically interconnected to lead posts 1104, 1106, and 1108, a planar structure with wire interconnections using assembly techniques and materials discussed above, or interconnected using a combination of vertical interconnection, planar structures, and wire interconnection. Circuit 1102 and lead posts 1104, 1106, and 1108 may be connected to integrated circuits dice 1112 and/or 1114 using the wire interconnection assembly techniques and materials discussed above or by flip chip bonding. ICP configuration 1100 may be utilized when the die pad 1110 size allows for proximately locating three or more leads. Extending lead post 1104 eliminates the processing steps associated with the addition of metal strips and wire interconnections. Other advantages discussed in conjunction with ICP configuration 1000 are applicable to ICP configuration 1100. The die pad 1110 configuration may be variously dimensioned to accommodate virtually any lead post arrangement allowing separate circuit bridging between multiple lead posts and sets of multiple lead posts.

Figure 12:
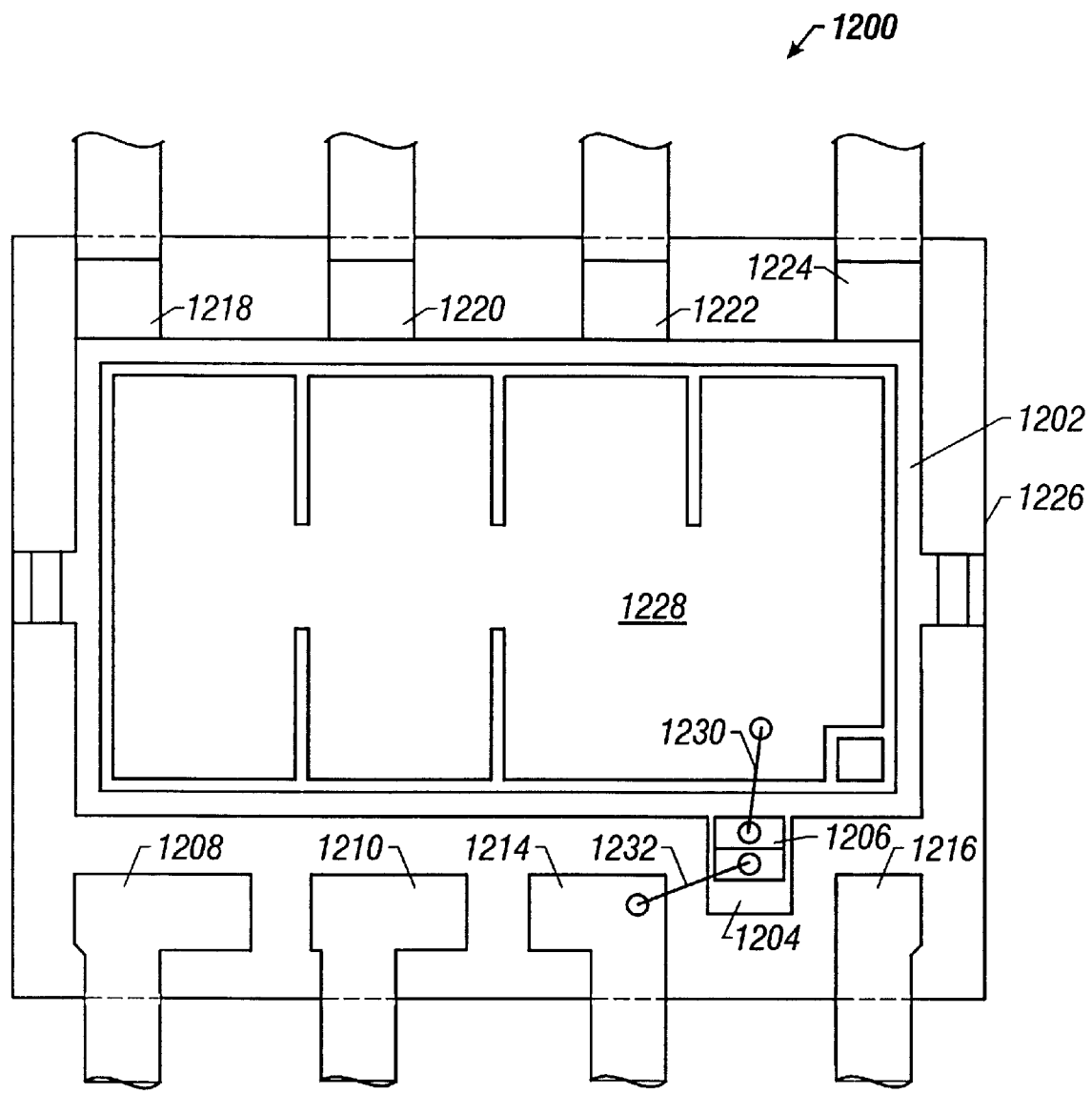
FIG. 12 illustrates a cross-sectional top view of a packaged integrated circuit with a die pad extension and an additional separate circuit mounted on the die pad extension.

Referring to FIG. 12, a cross-sectional view of SOIC ICP configuration 1200 is illustrated. FIG. 12 illustrates placement of a die pad extension in an unused region between lead posts. The die pad extension provides an additional circuit mounting platform for additional separate circuits.

ICP configuration 1200 includes die pad 1202 with a 0.028×0.016 inch (0.711×0.406 mm) die pad extension 1204 of a size suitable to accommodate separate circuit 1206 within plastic encapsulant 1226. Die pad extension 1204 is preferably formed as a co-planar, integral part of die pad 1202. After reading this disclosure, it will be understood by one of ordinary skill in the art that well-known methods may be used to fabricate die pad extension 1204. Lead post 1216 is preferably separated from die pad extension 1204 by at least 0.005 inches (0.127 mm) to provide electrical isolation.

Circuit 1206 is interconnected (not shown) to integrated circuit 1228 and/or lead posts 1208, 1210, 1214, 1216, 1218, 1220, 1222, and/or 1224 with metal strips or wire interconnections using assembly techniques and materials discussed above. Circuit 1206 may be attached to die pad extension 1204 using suitable conventional materials and techniques. Additionally, circuit 1206 may be electrically connected or electrically isolated from die pad extension 1204. Bond wires 1230 and 1232 interconnect separate circuit 1206 to integrated circuit die 1228 and lead post 1214, respectively.

ICP configuration 1200 offers the advantages discussed above in conjunction with a separate circuit enclosed within a common plastic encapsulant. Additionally, low profile advantages can be achieved through the utilization of low profile interconnections. Furthermore, ICP configuration 1200 also offers the versatile interconnectability options.

Figure 13:
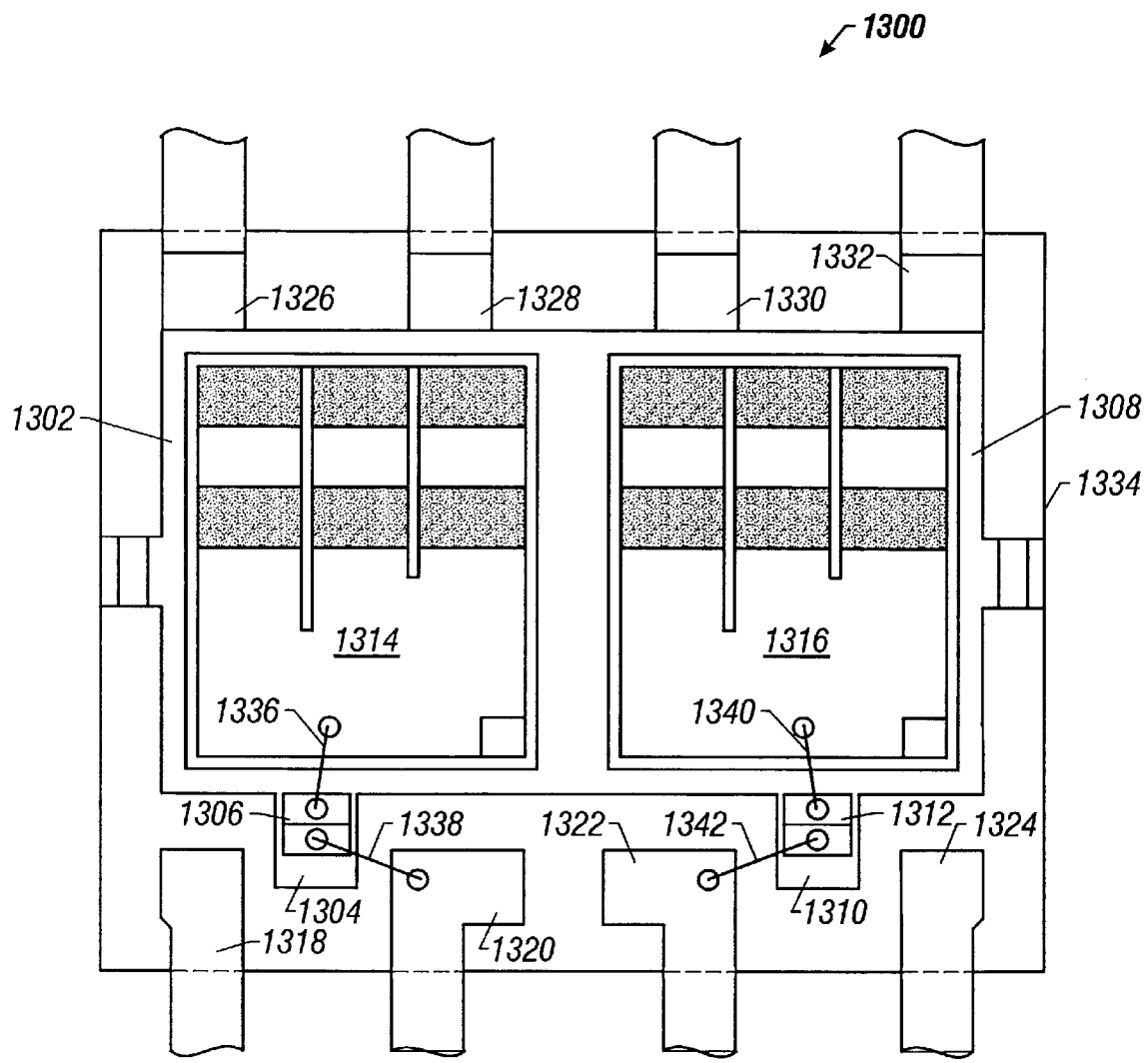
FIG. 13 illustrates a cross-sectional top view of two co-packaged integrated circuits with respective die pad extensions and additional separate circuits mounted on the respective die pads.

Referring to FIG. 13, a cross-sectional view of SOIC ICP configuration 1300 is illustrated. ICP configuration 1300 includes 0.100×0.078 (2.54×1.98 mm) inch die pad 1302 with a die pad extension 1304 of a size suitable to accommodate separate circuit 1306, and 0.100×0.078 inch (2.54× 1.98 mm) die pad 1308 with a die pad extension 1310 of a size suitable to accommodate separate circuit 1312 within plastic encapsulant 1334. Bond wires 1336 and 1338 interconnect circuit 1306 to 0.092×0.072 inch (2.34×1.83 mm) integrated circuit 1314 and lead post 1320, respectively using assembly techniques and materials discussed above. Bond wires 1340 and 1342 interconnect circuit 1312 to 0.092×0.072 inch (2.34×1.83 mm) integrated circuit 1316 and lead post 1322, respectively using assembly techniques and materials discussed above. Circuits 1306 and 1312 may be attached to die pad extensions 1304 and 1310, respectively, using suitable conventional materials and techniques. Additionally, circuits 1306 and 1312 may be electrically connected or electrically isolated from die pad extensions 1304 and 1310, respectively.

ICP configuration 1300 offers the advantages discussed above in conjunction with a separate circuits enclosed within a common plastic encapsulant. Additionally, low profile and versatile interconnectability advantages can be achieved as discussed above with ICP configuration 1200.

While the invention has been described with respect to the embodiments and variations set forth above, these embodiments and variations are illustrative and the invention is not to be considered limited in scope to these embodiments and variations. For example, while FIGS. 1, 2, 4, 5, and 9–12 each illustrate one separate circuit and FIGS. 6–8 illustrate two separate circuits, additional separate circuits may be incorporated into the respective ICP configurations to provide desired functions. Also, although integrated circuits are discussed in conjunction with FIGS. 1–13, any semiconductor device, integrated or otherwise, may be used in conjunction with intra-package separate circuits. Additionally, although specific interconnection sites are illustrated in FIGS. 1–13, respectively, it will be understood by one of ordinary skill in the art after reading this description that other interconnection sites useful with specific circuits may be utilized. Also, the separate circuits may be connected, through electrical interconnections, to circuits within the same package and/or to circuits external to the package.

Furthermore, a combination of metal strip, wire bond interconnections, and vertical interconnections may be used as well as other interconnection methods and materials. Moreover, additional integrated circuits may be mounted within a single housing and coupled to one or more separate circuits. In FIGS. 12 and 13, ICP configurations 1200 and 1300 may incorporate additional die pad extensions in unused portions of the respective ICP configuration for additional separate circuits. Die pad extensions and lead posts may also be used in combination as mounting platforms for separate circuits. Additionally, separate circuit devices may have multiple terminal sites on one or a combination surfaces. Although SOIC particular in this description or packages, for example, DIP, PDIP, ZIP, TSSOP, SOJ, SOP, TSOP, and other IC packages are suitable as well. Also, although plastic encapsulants have been discussed, other encapsulant materials may be utilized as well. Moreover, dimensions specified herein are illustrative and other dimensions may be used. Accordingly, various other embodiments and modifications and improvements not described herein may be within the spirit and scope of the present invention, as defined by the following claims.

What is claimed is:

1. A circuit package configuration comprising:
   an encapsulant having an interior region and a periphery region;
   a die pad disposed within the encapsulant;
   an integrated circuit die disposed on the die pad in the interior region of the encapsulant;
   a first circuit mounting platform disposed in the encapsulant periphery region;
   a second circuit mounting platform disposed in the encapsulant periphery region, wherein the first and second circuit mounting platforms are discontinuous; and
   a circuit device having at least one circuit element selected from the group consisting of an inductor, a capacitor, a transistor, a diode, a fuse, and a switch, said circuit device further having a first portion facing the first circuit mounting platform and a second portion facing the second circuit mounting platform, wherein the first portion of the circuit device includes a conductive contact connected to the first circuit mounting platform and the second portion of the circuit device includes a conductive contact connected to the second circuit mounting platform.

2. A circuit package configuration as in claim 1 wherein the circuit device is electrically coupled to the integrated circuit die.

3. A circuit package configuration as in claim 1 wherein the first and second circuit mounting platforms are lead posts.

4. A circuit package configuration as in claim 1 further comprising:
   a third circuit mounting platform disposed within the encapsulant, wherein the first, second, and third circuit mounting platforms are discontinous;
   wherein the circuit device further includes a third portion facing the third circuit mounting platform, and the third portion of the circuit device includes a conductive contact connected to the third circuit mounting platform.

5. A circuit package configuration as in claim 1 the circuit package configuration further comprising:
   a plurality of lead posts disposed in the encapsulant periphery region, wherein the first and second circuit mounting platforms are respective lead posts.

6. A circuit package configuration as in claim 1 further comprising:
   a first conductor coupled between the circuit device and the integrated circuit die.

7. A circuit package configuration as in claim 1 wherein the circuit device is a diode.

8. A circuit package configuration as in claim 1 wherein the conductive contacts are comprised of metal and are connected to the respective circuit mounting platforms with a conductive material from the group comprised of conductive epoxy, soldering material, and eutectic materials.

9. A circuit package configuration as in claim 1 wherein the encapsulant is comprised of a plastic material.

10. An integrated circuit package configuration comprising:

a plurality of lead posts;

an encapsulant having an interior region and having a periphery region encompassing the lead posts and circumscribing the interior region;

a die pad disposed within the encapsulant interior region;

an integrated circuit die disposed on the die pad;

a first circuit mounting platform disposed in the encapsulant periphery region;

a second circuit mounting platform disposed in the encapsulant periphery region, wherein the second circuit mounting platform is separated from the first circuit mounting platform to provide electrical isolation between the first and second circuit mounting platforms; and a circuit device having at least one circuit element selected from the group consisting of an inductor, a capacitor, a transistor, a diode, a fuse, and a switch, said circuit device further bridged between the first and second circuit mounting platforms and electrically coupled to the integrated circuit die and having a first bottom portion facing the first circuit mounting platform and a second bottom portion facing the second circuit mounting platform, wherein the first bottom portion of the circuit device includes a conductive contact connected to the first circuit mounting platform and the second bottom portion of the circuit device includes a conductive contact connected to the second circuit mounting platform.

11. An integrated circuit package configuration as in claim 10 further comprising:

a first conductor coupled between the circuit device and one of the lead posts; and a second conductor coupled between the circuit device and the integrated circuit die.

12. An integrated circuit package configuration as in claim 11 wherein the first and second conductors are wires.

13. An integrated circuit package configuration as in claim 11 wherein the first conductor is a metal strip.

14. An integrated circuit package configuration as in claim 10 wherein the circuit device is an electrostatic discharge protection circuit device.

15. An integrated circuit package configuration as in claim 10 wherein the first circuit mounting platform is a lead post.

16. An integrated circuit package configuration as in claim 10 further comprising a third circuit mounting platform disposed within the encapsulant, wherein the third circuit mounting platform is separated from the first and second circuit mounting platform to provide electrical isolation between the first, second, and third circuit mounting platforms;

wherein the circuit device further includes a third portion facing the third circuit mounting platform, and the third portion of the circuit device includes a conductive contact coupled to the third circuit mounting platform.

17. An integrated circuit package configuration as in claim 10 wherein the circuit device is a planar structure bonded to the first and second circuit mounting platforms.

18. An integrated circuit package configuration as in claim 10 further comprising:

a third circuit mounting platform disposed in the encapsulant periphery region;

a fourth circuit mounting platform disposed in the encapsulant periphery region, wherein the fourth circuit mounting platform is separated from the third circuit mounting platform to provide electrical isolation between the third and fourth circuit mounting platforms; and a second circuit device bridged between the first and second circuit mounting platforms and electrically coupled to the integrated circuit die and having a first bottom portion facing the third circuit mounting platform and a second bottom portion facing the fourth circuit mounting platform, wherein the first bottom portion of the circuit device includes a conductive contact connected to the third circuit mounting platform and the second bottom portion of the circuit device includes a conductive contact connected to the fourth circuit mounting platform.

19. An integrated circuit package configuration as in claim 18 wherein the third circuit mounting platform is a lead post, and the second circuit device mounting platform is a lead post.

20. An integrated circuit package configuration as in claim 10 wherein the integrated circuit package configuration includes small outline integrated package features.

21. An apparatus comprising:

a plurality of discontinuous lead posts disposed within a circuit package configuration;

a circuit device having at least one circuit element selected from the group consisting of an inductor, a capacitor, a transistor, a diode, a fuse, and a switch, said circuit device further having a first portion facing a first lead post and a second portion facing a second lead post, wherein the first portion of the circuit device includes a conductive contact connected to the first lead post and the second portion of the circuit device includes a conductive contact connected to the second lead post; and an integrated circuit die disposed within the circuit package configuration and electrically coupled to the circuit device.

22. An apparatus as in claim 21 wherein the conductive contacts are comprised of metal and are connected to the respective circuit mounting platforms with a conductive material from the group comprised of conductive epoxy, soldering material, and eutectic materials.

23. An apparatus as in claim 21 further comprising:

a first wire conductor coupled between the circuit device and the first lead post;

a second wire conductor coupled between the circuit device and the integrated circuit die; and a plurality of wire conductors coupled between the lead posts and the integrated circuit die.

24. An apparatus as in claim 21 wherein the plurality of lead posts includes a third lead post, the circuit package configuration further comprising:

a second circuit device disposed on the third lead post.

25. An apparatus as in claim 21 further comprising:

a die pad having a die pad extension, wherein the integrated circuit die is disposed on the die pad and a portion of the die pad extension is disposed between two of the lead posts; and a second circuit device disposed on the die pad extension.

26. An apparatus as in claim 21 wherein the circuit device is an electrostatic discharge circuit device.

27. An apparatus as in claim 21 wherein the circuit device is a second integrated circuit die.

28. An apparatus as in claim 21 wherein the circuit package configuration includes thin shrunk small outline package features.

29. An apparatus as in claim 21 wherein the circuit device is a planar structure.

30. An apparatus as in claim 21 further comprising:

a second circuit device having a first portion facing a third lead post and a second portion facing a fourth lead post, wherein the first portion of the circuit device includes a conductive contact coupled to the third lead post and the second portion of the circuit device includes a conductive contact connected to the fourth lead post.

31. A circuit package configuration as in claim 1 further comprising:

a plurality of additional circuit mounting platforms disposed within the encapsulant;

a first plurality of circuits bridged between respective ones of the additional circuit mounting platforms; and a second plurality of circuits disposed on respective ones of the additional circuit mounting platforms.

* * * * *